United States Patent
Lee et al.

(10) Patent No.: US 12,222,542 B2
(45) Date of Patent: Feb. 11, 2025

(54) PHOTONIC DEVICE ON A SEMICONDUCTOR-ON-INSULATOR SUBSTRATE AND METHOD OF MANUFACTURING THEREOF

(71) Applicant: Taiwan Semiconductor Manufacturing Company, Ltd., Hsinchu (TW)

(72) Inventors: Yueh Ying Lee, Hsinchu (TW); Tzu-Chung Tsai, Hsinchu (TW); Chien-Ying Wu, Hsinchu (TW); Jhih-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 232 days.

(21) Appl. No.: 17/560,001

(22) Filed: Dec. 22, 2021

(65) Prior Publication Data

US 2022/0342149 A1 Oct. 27, 2022

Related U.S. Application Data

(60) Provisional application No. 63/178,796, filed on Apr. 23, 2021.

(51) Int. Cl.
G02B 6/122 (2006.01)
G02B 6/136 (2006.01)

(52) U.S. Cl.
CPC ............ *G02B 6/122* (2013.01); *G02B 6/136* (2013.01)

(58) Field of Classification Search
CPC .... G02B 6/122; G02B 6/136; G02B 6/12004; G02B 6/30; H01L 31/022408; H01L 31/02327; H01L 21/00
See application file for complete search history.

(56) References Cited

U.S. PATENT DOCUMENTS

| | | | |
|---|---|---|---|
| 11,789,208 B1 * | 10/2023 | Bian | G02B 6/12002 385/43 |
| 2022/0196909 A1 * | 6/2022 | Holt | G02B 6/136 |
| 2022/0268994 A1 * | 8/2022 | Sahin | G02B 6/122 |

* cited by examiner

*Primary Examiner* — Michael P Mooney
(74) *Attorney, Agent, or Firm* — FOLEY & LARDNER LLP

(57) ABSTRACT

A method of fabricating a photonic device includes: forming a photonic device structure that includes a SOI substrate, which includes a bulk substrate layer, a buried oxide layer on the bulk substrate layer and an active semiconductor layer on the buried oxide layer; forming an electrically conducting layer in electrical contact of the buried oxide layer, and forming a BEOL structure on a surface of the active silicon layer.

20 Claims, 11 Drawing Sheets

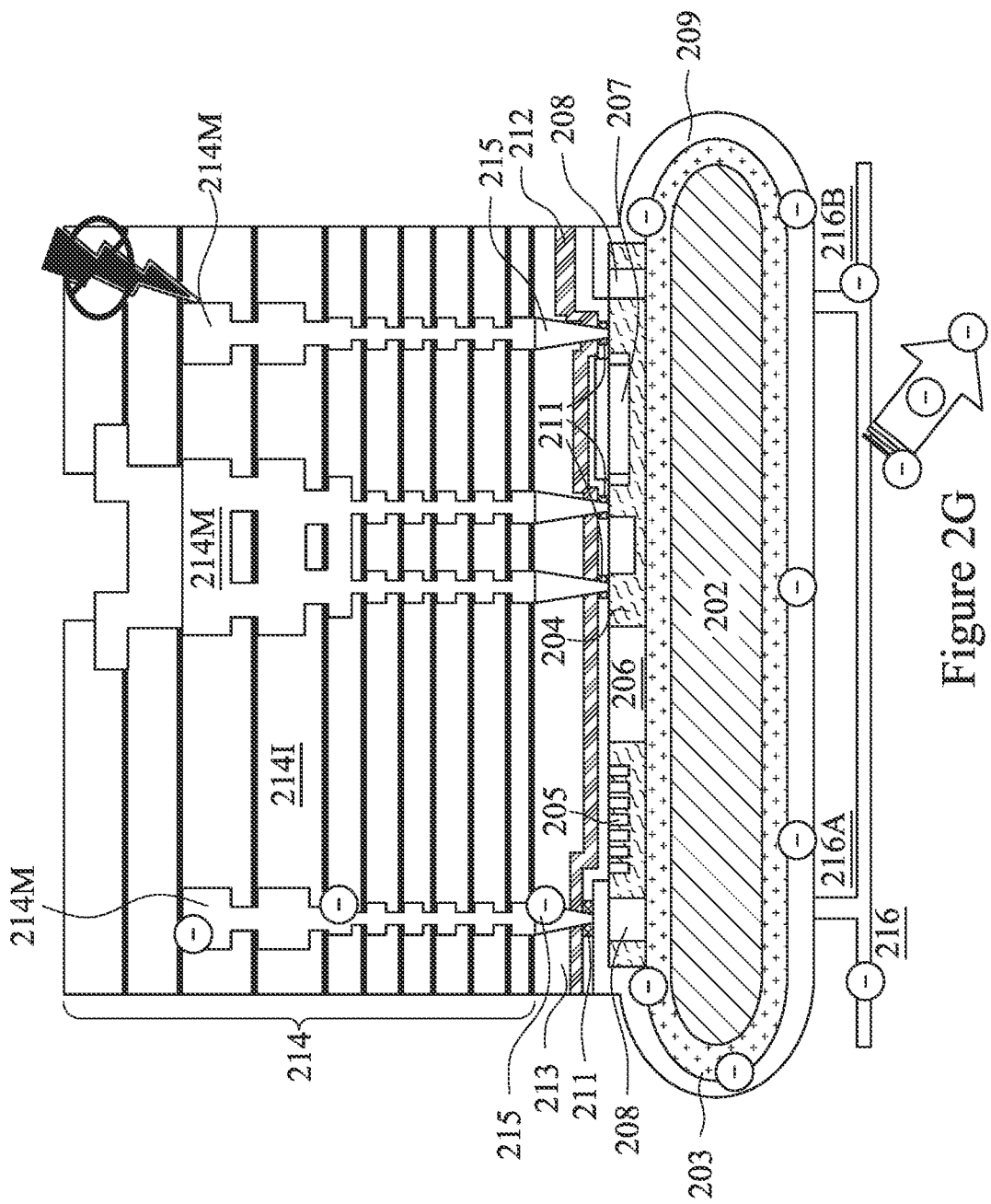

PHOTONIC DEVICE ON A SEMICONDUCTOR-ON-INSULATOR SUBSTRATE AND METHOD OF MANUFACTURING THEREOF

CROSS-REFERENCE TO RELATED APPLICATION

This application claims priority to and the benefit of U.S. Provisional Application No. 63/178,796, filed Apr. 23, 2021, entitled "Conductive Film for Si Photonics SOI Wafer," which is incorporated herein by reference in its entirety for all purposes.

BACKGROUND

Photonic and/or optoelectronic devices may be fabricated using complementary metal oxide semiconductor (CMOS) technology on a semiconductor-on-insulator (SOI) substrate. However, certain processes involved into fabricating of such devices, such as etching or processes involving spinning, such as lithography, may lead to undesirable charging, i.e. accumulation of static electrical charges in a buried oxide layer of the SOI substrate. For example, such charging may contribute to undesirable arcing. The charging may also lead to shifts in etching rates. In addition, the charging may affect a quality of measurements of a phototonic and/or optoelectronic device with an electron microscopy, such as a measurement of critical dimensions of the device with a scanning electron microscope (CDSEM measurement).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A-J are cross-section views illustrating operations of an example method, which can be used for fabricating a photonic and/or optoelectronic device, using an additional electrically conducting layer.

DETAILED DESCRIPTION

Figure 1:
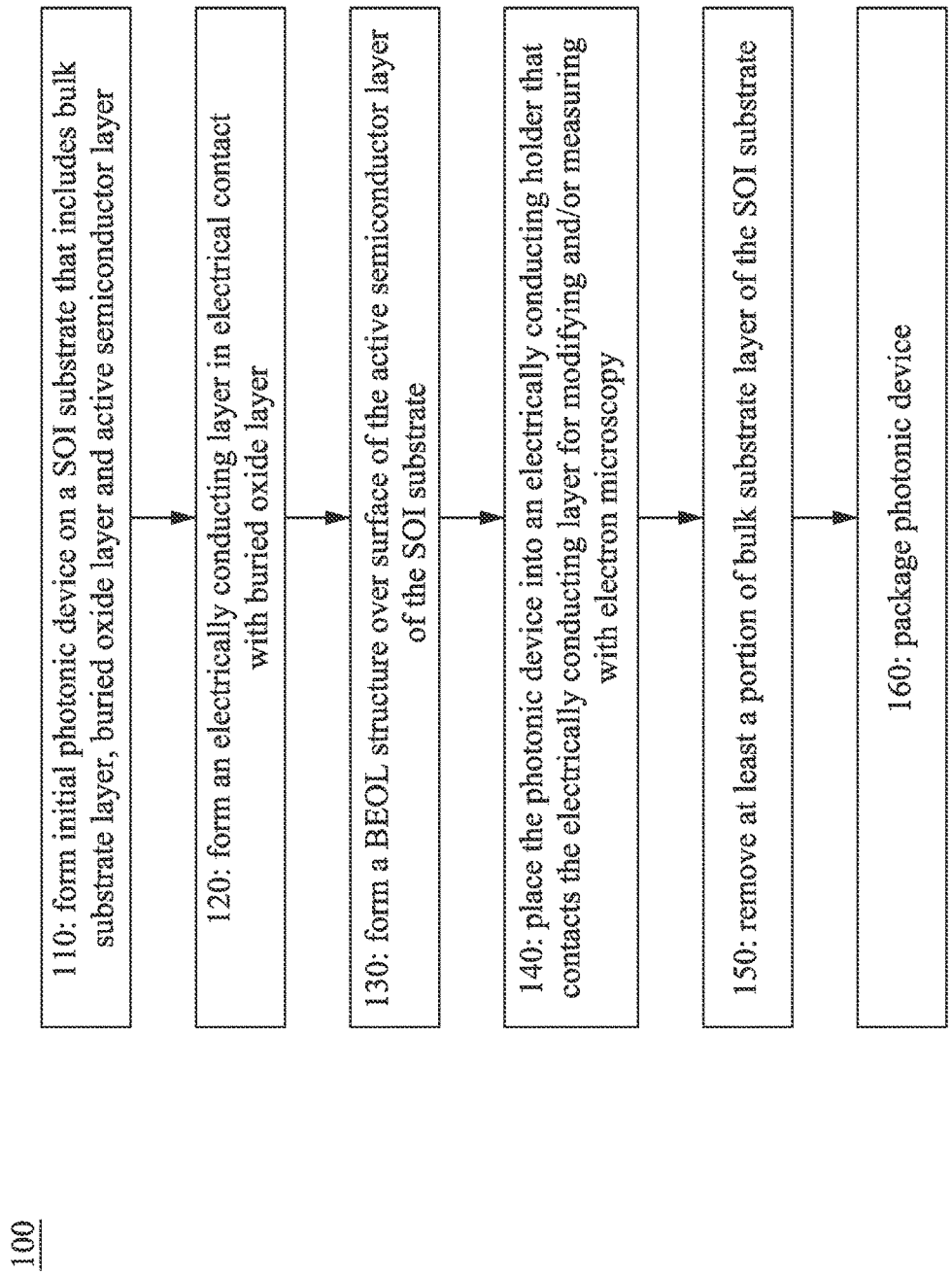
FIG. 1 is a flow chart of an example method, which can be used for fabricating a photonic and/or optoelectronic device, using an additional electrically conducting layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure proposes using in a process of fabricating a phototonic and/or optoelectronic device on an SOI substrate an additional electrically conducting layer, which is in electrical contact with a buried oxide layer of the SOI substrate. Such additional electrically conducting layer may provide an electrical path for releasing an electrical charge, which could otherwise accumulate in the buried oxide layer.

FIG. 1 illustrates example process 100 a process of fabricating a photonic and/or optoelectronic device on an SOI substrate using an additional electrically conducting layer. Process 100 involves operation 110 of forming an initial photonic device of an SOI substrate, which includes a bulk substrate layer, a buried oxide layer on the bulk substrate layer and an active semiconductor layer on the buried oxide layer. Process 100 also involves operation 120 of forming an electrically conducting layer in electrical contact with the buried oxide layer. The electrically conducting layer in electrical contact with the buried oxide layer may provide an electrical path to release an electric charge which could accumulate in the buried oxide. The electrically conducting layer may be electrically connected with at least two points of the buried oxide layer, while providing a continuous electrical path between the two points. Process 100 may include operation 130 of forming a back end of line (BEOL) structure over a surface of the active semiconductor layer of the SOI substrate. The BEOL structure may be formed in such way so that the electrically conducting layer in an electrical contact with a metal routing of the BEOL structure. Process 100 may also involve operation 140 of placing the device with the formed BEOL structure and the electrically conducting layer in an electrically conducting holder for further modification and/or measuring, such as measuring by an electron microscopy.

Process 100 may also involve operation 150 of removing a portion of or the whole of the bulk substrate layer of the SOI substrate may be removed. In some embodiments, the bulk substrate layer may be removed using a two-step grind and etch back process. For example, a first step of the bulk substrate removal may include a mechanical grinding process to remove a majority of the bulk substrate layer, followed by a selective chemical etch process to remove a remaining portion of the bulk substrate layer, selective to the buried oxide layer. Such two-step process may ensure that the buried oxide layer is not over etched, which could occur if grinding is used alone. The removal of the bulk substrate layer may leave the device with only portion(s) of the electrically conducting layer in contact with respective portion(s) of the buried oxide layer.

Process 100 may also include operation 160 of packaging of the device with one or more other electronic chips. In some embodiments, the device may be connected to another chip via wire bonding. Yet in some embodiments, the device may connected to another chip using one or more vias extending through a thickness of the buried oxide layer and thereby electrically connecting an electronic component, such as a gate structure in the active semiconductor layer of the device, with another chip aligned at least partially underneath the device.

Figure 2A:
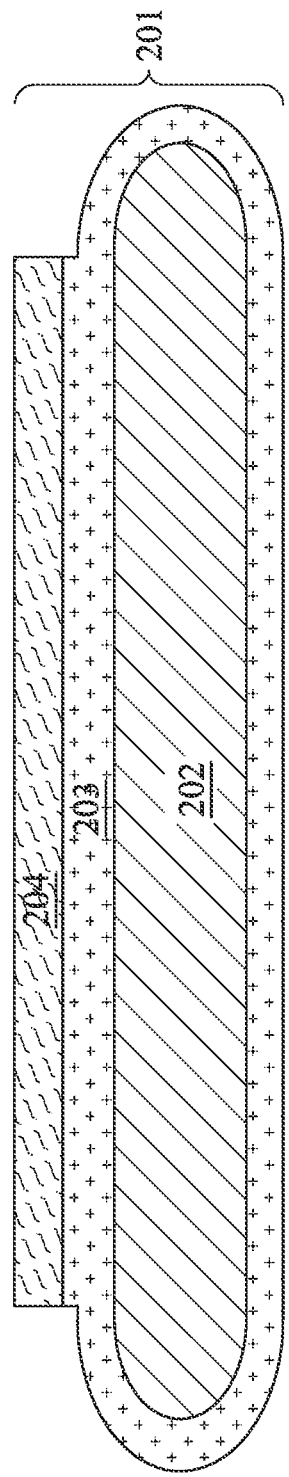

FIG. 2A shows a cross-section of SOI substrate 201, which may be used for fabricating a photonic and/or optoelectronic device. SOI substrate 201 includes bulk substrate layer 202, buried oxide layer 203 on bulk substrate layer 202 and active semiconductor layer 204, which may be, for example, an active silicon layer, on buried oxide layer 203. Bulk substrate layer 202 is typically a bulk semiconductor wafer. A thickness of active semiconductor layer 204 may be of about 50 nm to about 500 nm, such as 150 nm or 200 nm. In some embodiments, a thickness of buried oxide layer 203 may be at least 100 nm. In some embodiments, the thickness of buried oxide layer 203 may be significantly less, e.g. at least 2 times less, or at least 3 times less, or at least 5 times less or at least 10 times less, than a wavelength of light used by the fabricated photonic and/or optoelectronic device. For example, when the photonic and/or optoelectronic device includes a waveguide patterned in active semiconductor layer 204, the thickness of buried oxide layer 203 may be significantly less e.g. at least 2 times less, or at least 3 times less, or at least 5 times less or at least 10 times less, than a wavelength of light used by the waveguide.

A material for each bulk substrate layer 202 and active semiconductor layer 204 may be independently selected from Group IV semiconductors, such as silicon, silicon germanium, Group III-V semiconductors and Group II-VI semiconductors. In some embodiments, bulk substrate layer 202 is a bulk silicon substrate and active semiconductor layer 204 is an active silicon layer. Buried oxide layer 203 may be silicon oxide or another dielectric material.

Figure 2B:
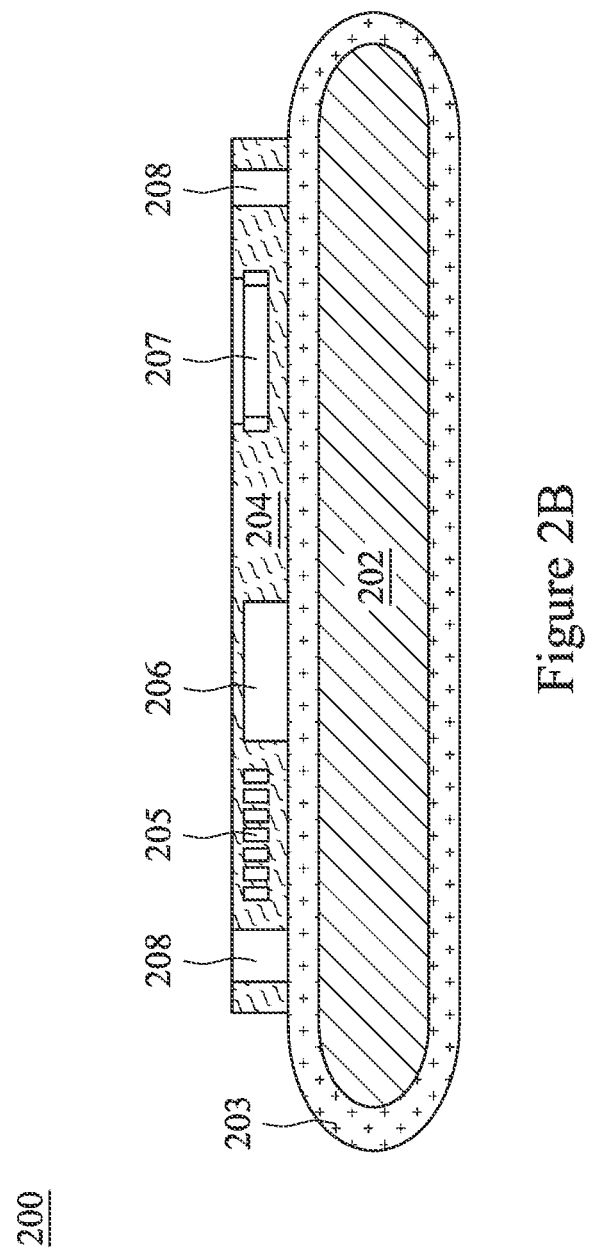

FIG. 2B schematically illustrates operation 110 of forming an initial photonic device 200 in active semiconductor layer 204 of SOI substrate 201. FIG. 2B shows waveguide 205, shallow trench isolation (STI) structure 206 and detector 207, such as a Si detector or a Ge detector, each patterned in active semiconductor layer 204. FIG. 2B also shows electrical contacts 208, which are made of an electrically conducting material, such as a metal, extending through the thickness of active semiconductor layer 204 from buried oxide layer 203 to an upper surface of active semiconductor layer 204. In some embodiments, electrical contacts 208 may be position at or close to opposite edges of active semiconductor layer 204 so that elements of the photonic device, such elements 205, 206 and/or 207 are positioned between two of electrical contacts 208.

Detector 207 may be used for transferring optical signals into electrical ones. In some embodiments, the photonic device may include at least one of waveguide 205, STI structure 206 and detector 207 patterned in active semiconductor layer 204. In some embodiments, the photonic device may include at least two of waveguide 205, STI structure 206 and detector 207 patterned in active semiconductor layer 204. For example, the device may include waveguide 205 and detector 207 patterned in active semiconductor layer 204. In some embodiments, the photonic device may include each of waveguide 205, STI structure 206 and detector 207 patterned in active semiconductor layer 204.

Waveguide 205, STI structure 206 and/or detector 207 may be formed by a process involving patterning corresponding trenches in active semiconductor layer 204. Such patterning may involve depositing a mask having a desired pattern and then forming trenches with a pattern for waveguide 205, STI structure 206 and/or detector 207 using an etching technique, such a dry etching technique, e.g. reactive ion etching (RIE).

Forming waveguide 205, STI structure 206 and/or detector 207 may also involve one or more of the following operations: filling the trenches with an oxide and/or dielectric material, such as silicon oxide; implanting the oxide and/or dielectric material with impurities; annealing; gate dielectric and gate polysilicon deposition; implanting for forming source/drain structures. Impurities used for implanting may be n-type impurities, such as phosphorus, arsenic or antimony or p-type impurities, such as boron. The implanting for waveguide 205 may include low-dose implanting, which may at impurity concentration of about $1 \times 10^{16}$ to $3 \times 10^{18}/cm^3$. The implanting for waveguide 205 may also include high dose implanting high dose implants at impurity concentrations above $5 \times 10^{18}/cm^3$. Such high dose implanting may be performed before the implanting for forming source/drain structures. When detector 207 is a Ge detector, operations for forming such detector may include dielectric deposition, a seed window opening for Ge; deposition of Ge and a capping layer; patterning Ge and the capping layer; Ge sidewall encapsulation and patterning; Ge crystallization and activation anneal.

Figure 2C:
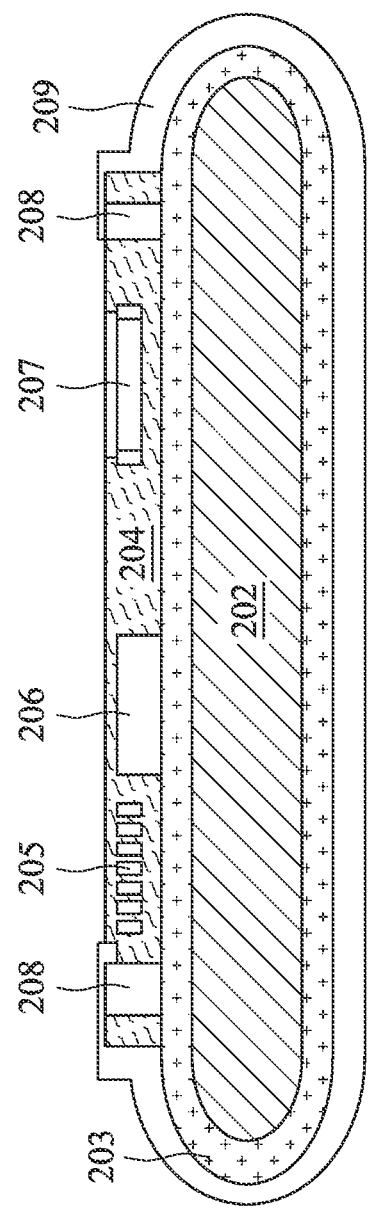

FIG. 2C schematically illustrates operation 120 of forming additional electrically conducting layer 209 in electrical contact with buried oxide layer 203. Electrically conducting layer 209 may provide a continuous electrical path between at least two points of buried oxide layer 203 to allow an electrical charge, which could otherwise accumulate in buried oxide layer 203 to be released through electrically conducting layer 209. In FIG. 2C, electrically conducting layer 209 has an electrical contact with buried oxide layer 203 through electrical contacts 208 on opposite sides of active semiconductor layer 204, while providing a continuous electrical path between electrical contacts 208. Each of electrical contacts 208 extends through the thickness of active semiconductor layer. In FIG. 2C, electrically conducting layer 209 is also in direct physical contact (and thus, in electrical contact) with a portion of buried oxide layer 203 not covered by active semiconductor layer 204. For example, electrically conducting layer 209 may extend along sidewalls of SOI substrate 201/bulk substrate layer 202/buried oxide layer 203 and along the lower/back surface of SOI substrate 201/bulk substrate layer 202/buried oxide layer 203.

Electrically conducting layer 209 is formed from an electrically conducting material, which may be, for example, a doped polysilicon or a doped conducting polymer, such as doped polyaniline, doped polythiophene or a doped polypyrrole. A conductivity of the material of electrically conducting layer 209 is higher than a conductivity of buried oxide layer 203, a conductivity of active semiconductor layer 204 and a conductivity of bulk semiconductor layer 202. In some embodiments, a conductivity of the electrically conducting material forming electrically conducting layer 209 may be at least $1 \times 10^{-3}$ S/cm, at least $2 \times 10^{-3}$ S/cm, at least $3 \times 10^{-3}$ S/cm, at least $5 \times 10^{-3}$ S/cm, at least $1 \times 10^{-2}$ S/cm, at least $1 \times 10^{-1}$ S/cm, at least 1 S/cm or at least 10 S/cm. A thickness of electrically conducting layer 209 may vary. In some embodiments, the thickness of electrically conducting layer may be from 1 μm to 1000 μm or 2 μm to 500 μm or from 3 μm to 400 μm or any value or subrange within these ranges. Electrically conducting layer 209 may be formed using a number of processes. In some embodiments, electrically conducting layer 209 may be formed by a furnace process.

Figure 2D:
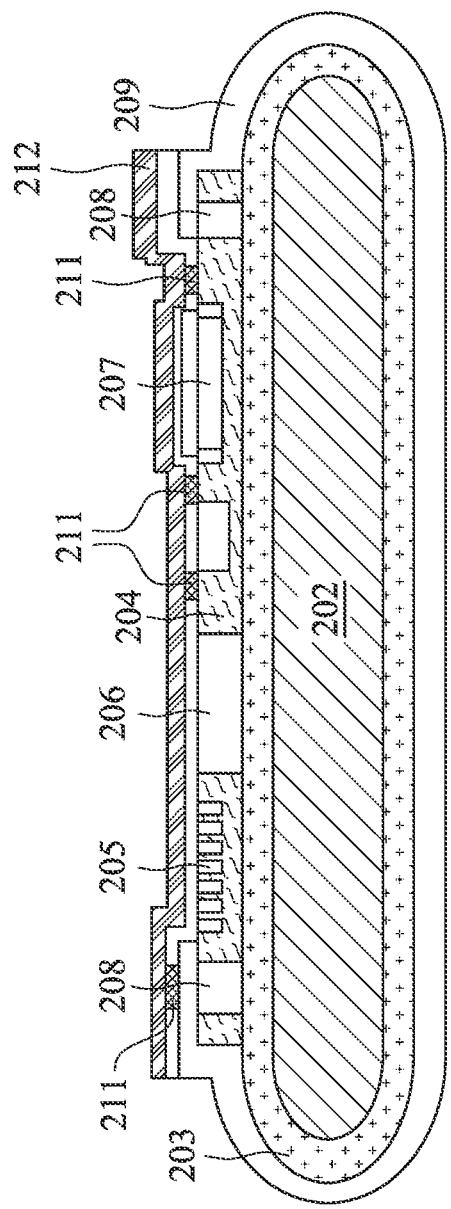

FIG. 2D schematically shows forming a patterned silicide layer and forming optional resist protective oxide layer 212 over the patterned silicide layer over a surface of active semiconductor layer 204. The patterned silicide layer includes silicide features 211, which may be used for defining locations of contacts with metallization structures in a subsequently formed BEOL structure. At least one silicide feature 211 may be in electrical contact (or in direct contact) with electrically conducting layer 209. In some embodiments, at least one silicide feature 211 may be over one of electrical contacts 208. Such arrangement may allow establishing an electrical contact between electrically conducting layer 209 and a metallization structure of the later formed BEOL structure. Optional resist protective oxide layer 212 may comprise an oxide, such as silicon oxide, and have a thickness of several hundred angstroms, such as from 150 A to 500 A.

Figure 2E:
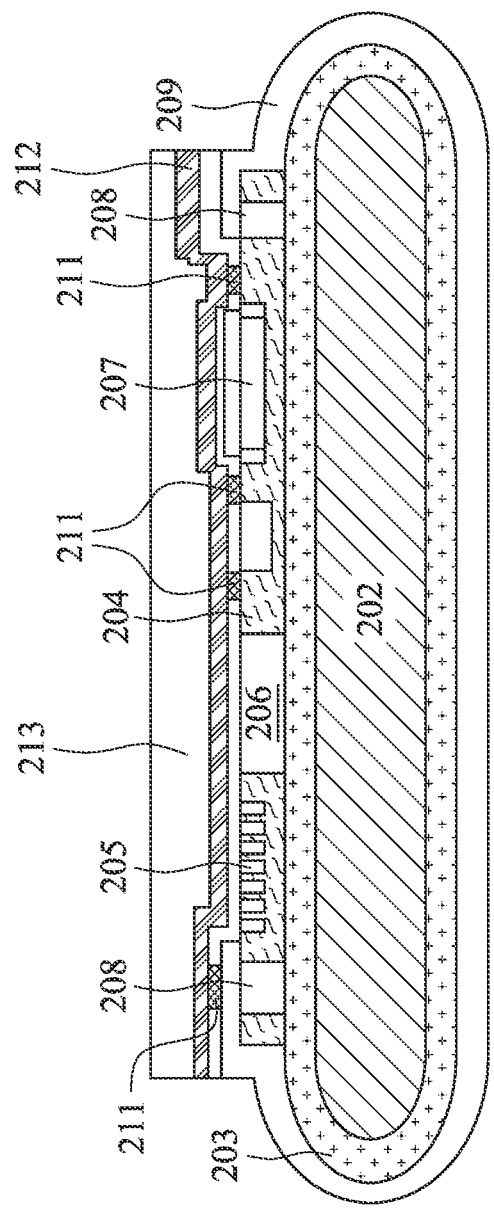

FIG. 2E shows forming interlayer dielectric layer 213, which may be formed of a low-k dielectric material, such as a dielectric material having a dielectric constant of less than 3.9, over the upper surface of active semiconductor layer 204. Examples of low-k dielectric materials include silicon oxide doped with fluorine or carbon, porous silicon oxide, which may be updoped or doped with carbon; hafnium silicate, zirconium silicate.

Figure 2F:
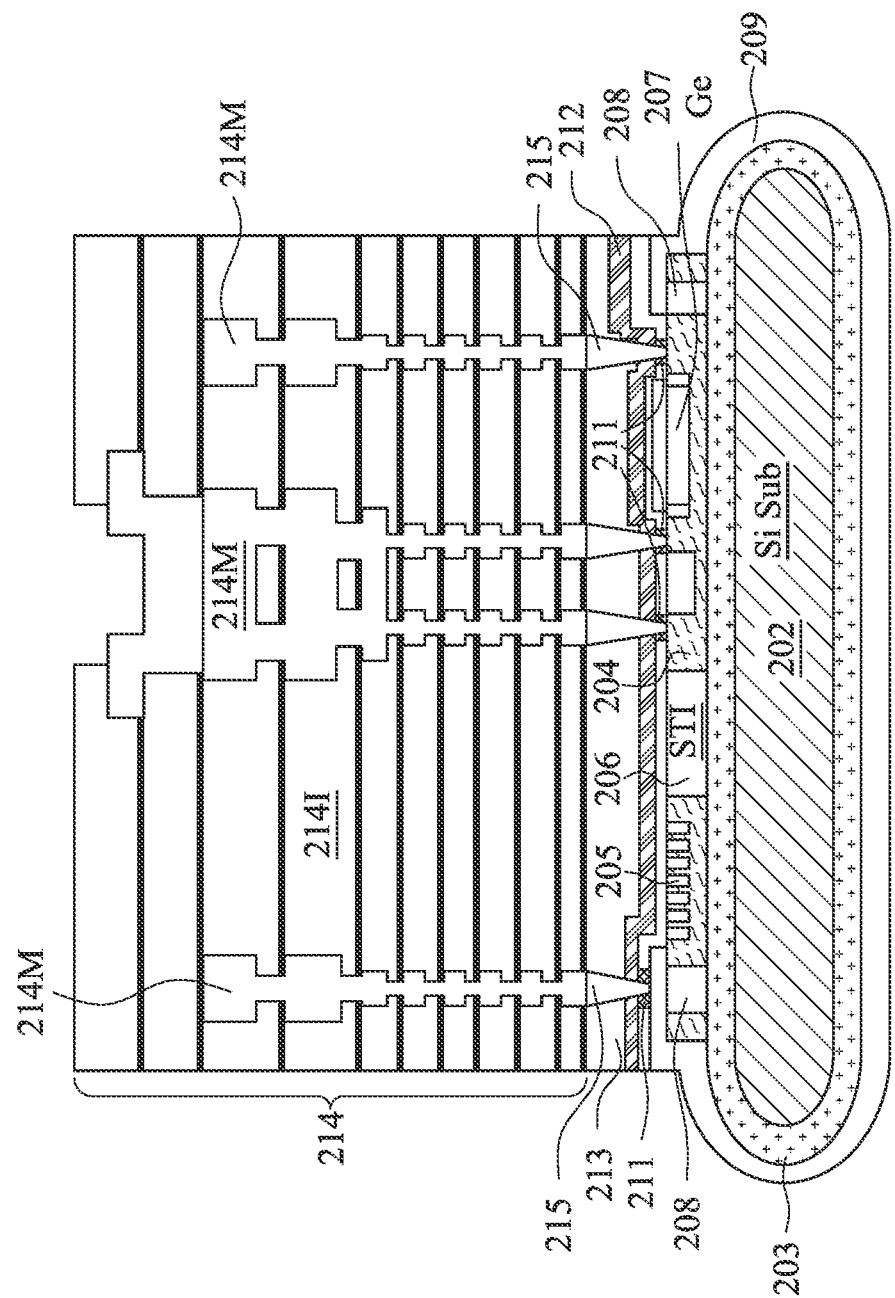

FIG. 2F illustrates operation 130 of BEOL (back-end-of-line) structure 214 over the upper surface of active semiconductor layer 204. BEOL structure 214 includes transmission lines and other interconnect structures that are implemented using and other interconnect structures that are implemented using a series of interconnected metallization structures, such as traces and conductive vias, 214M which are formed within various alternating conductive and insulating/dielectric layers of BEOL structure 214. Each metallization structure 214M may include a plurality of metallization layers with layer 214M0 being the closest to active semiconductor layer 204 with each subsequent layer, i.e. 214M1, 214M2, . . . 214Mn being further from active semiconductor layer 204. BEOL structure 214 includes a plurality of insulating dielectric layers 214I:214I0, 214I1, . . . , 214In, with layer 214I0 being the closest to active semiconductor layer 204. Metallization structures 214M are formed penetrating dielectric layers 214I of BEOL structure 214. BEOL structure 214 provides a network of interconnects to connect active circuitry and other components formed in active semiconductor layer 204 through electrical contacts 215 extending through interlayer dielectric layer 213 from respective closest layer 214M0 to features 211. At least one metallization structure 214M of BEOL structure 214 may be electrically connected to electrical contact 208 and/or electrically conducting layer 209 through one electrical contacts 215.

BEOL structure 214 may comprise a plurality of bonding/contact pads such as, for example, ground pads, DC power supply pads, input/output pads, control signal pads, associated wiring, etc., that are formed as part of a final metallization level of BEOL structure 214. In some embodiments, a thickness of the BEOL structure 214 is from 5 μm to 30 μm or from 10 μm to 20 μm or 10 μm to 15 μm.

FIG. 2G illustrates operation 140 when the photonic device 200, with electrically conducting layer 209 and BEOL structure 214, is placed in electrically conducting holder 216. Electrically conducting holder may be formed of an electrically conducting material, such as metal. Holder 216 has two points 216A and 216B of contact with electrically conducting layer 209. As such, holder 216 together with electrically conducting layer 209 provide an electrical path for electrical charge which could have otherwise accumulated in insulating layers, such as buried oxide layer 203. When in holder 216, device 200 may be subjected to modification, which could otherwise lead to electrical charge accumulation in insulating layer(s) of device 200, such as buried oxide layer 203. Such modification may, for example, etching, such as dry etching, e.g. plasma etching, through one or more insulating layers 214I of BEOL structure 214. The modification, which could otherwise lead to electrical charge accumulation in insulating layer(s) of device 200, such as buried oxide layer 203, could also be a spinning-based modification, i.e. a modification that involves spinning device 200 while in holder 216. The spinning-based modification may be, for example, a lithographic modification, i.e. a modification that involves performing lithography on device 200 while device 200 is spinning in holder 216. The spinning-based modification may also a spin coating procedure, such as wet spin coating. In some embodiments, when in holder 216, device 200 may be subjected to a measurement, which produces electrical charge distribution in layer(s) of device 200, such as buried oxide layer 203. For example, when in holder 216, device 200 may be subjected to electron microscopy, such as scanning electron microscopy (SEM), to measure one or more critical dimensions of the device. Because electrically conducting layer 209 in contact with holder 216 provides an electrical path for electrical charge from buried oxide layer 203, such measurements will not be affected by electrical charge, which could have accumulated in a buried oxide layer of a device without electrically conducting layer 209.

Figure 2H:
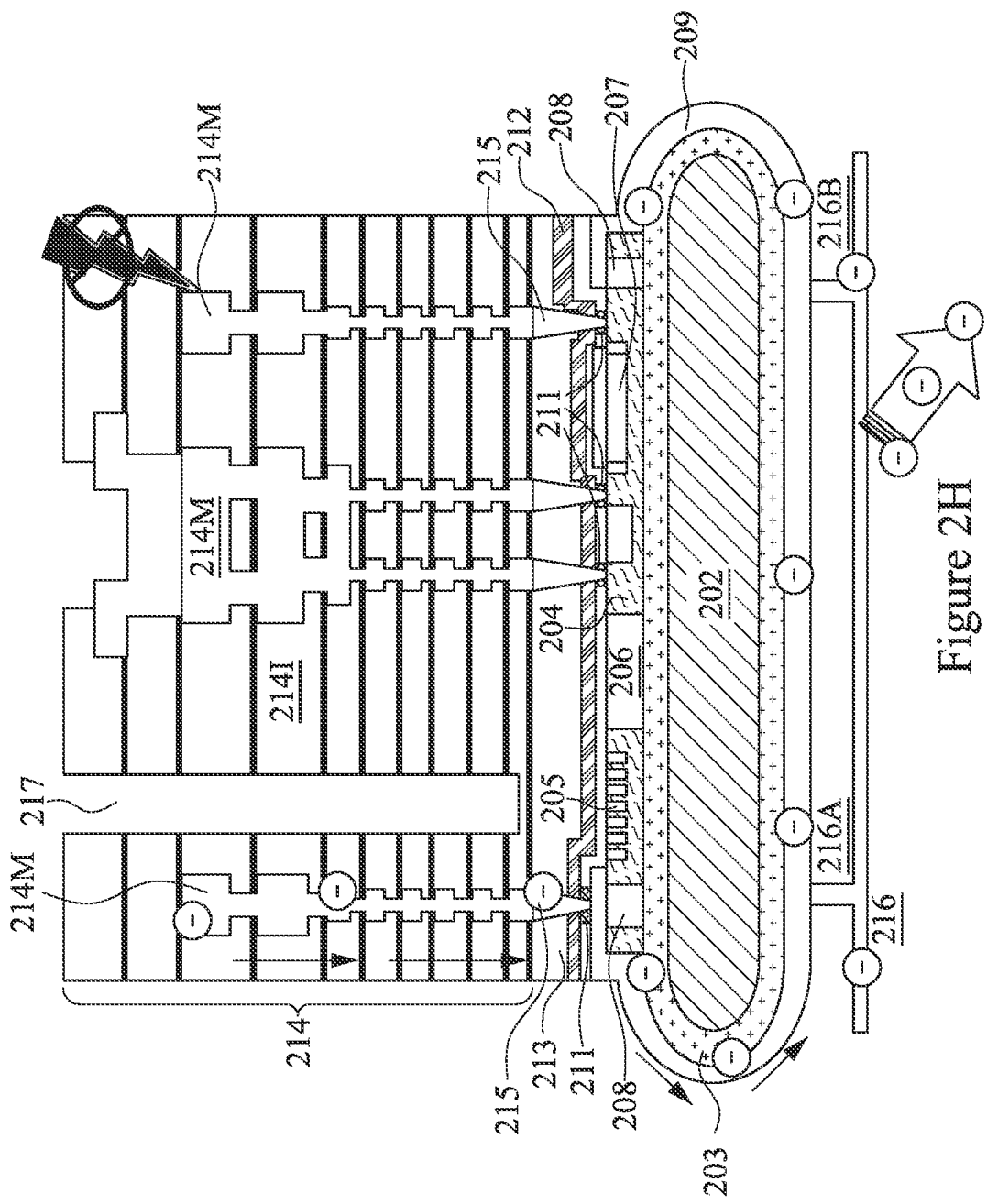

FIG. 2H shows device 200 with trench 217 etched through insulating layers 214I of BEOL structure 214. In FIG. 2H, trench 217 extends through insulating layers 214I of BEOL structure 214 towards waveguide 205 patterned in active semiconductor layer 204 of the SOI substrate 201. Trench 217 may be etched using a dry etching technique, such as plasma etching. Without electrically conductive layer 209, etching of through insulating layers of a BEOL structure could have resulted in arcing problem during the etching and etching rate shift due to an electrical charge, which could have accumulated in a buried oxide layer of an SOI substrate. Electrically conductive layer 209 in device 200 allows avoiding and/or reducing such problems because electrically conducing layer 209 together with holder 216 provide an electrical path for dissipating electrical charge from buried oxide layer 203 of the SOI substrate 201.

Figure 2I:
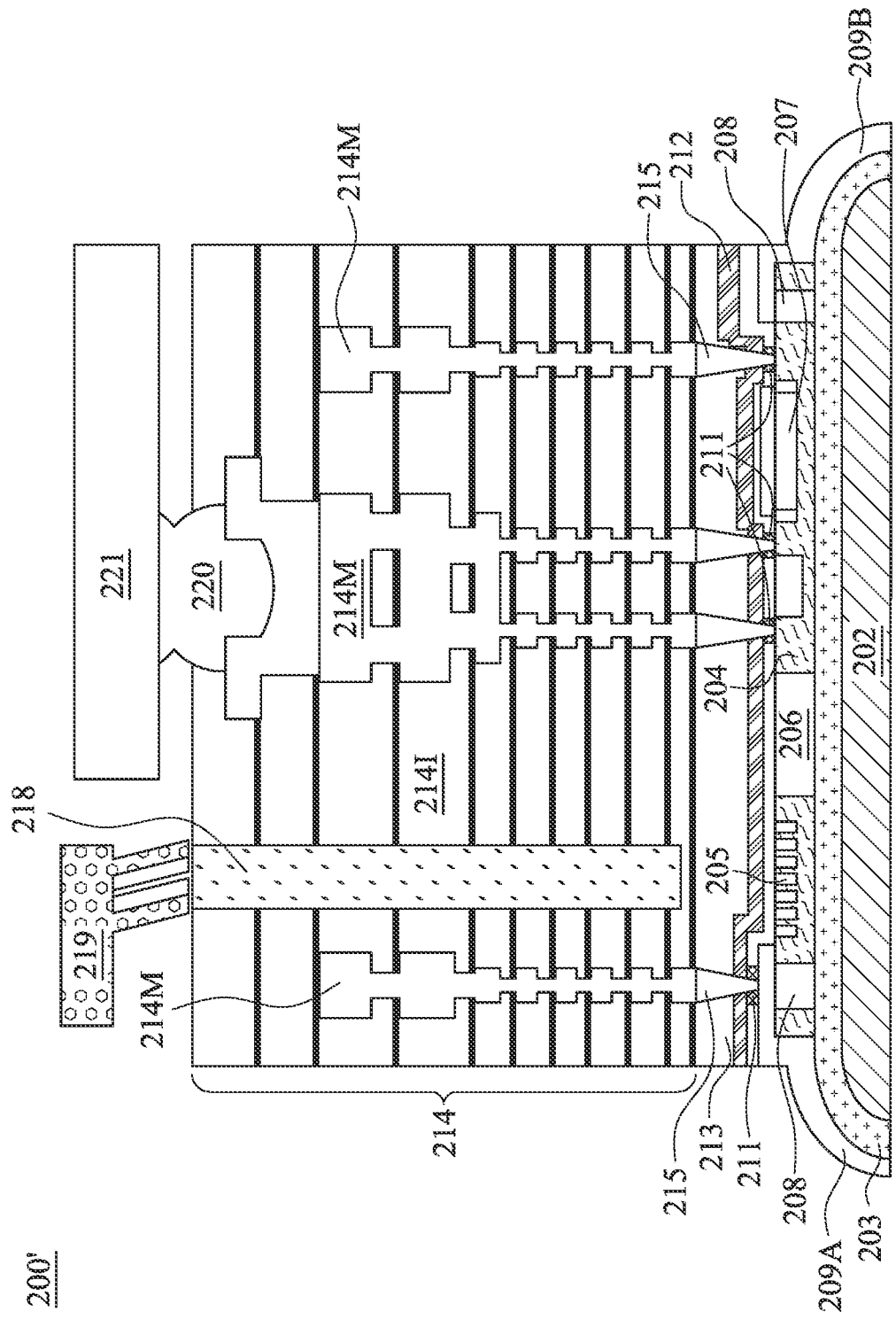

FIG. 2I shows photonic and/or optoelectronic device 200', which may be formed from device 200. In device 200', a bottom portion of bulk substrate layer 202 is removed according to operation 150 of FIG. 1. Although FIG. 2I shows removal of only of a portion of bulk substrate layer 202, in some embodiments, the whole bulk substrate layer 202 may be removed in operation 150. Removing of a portion or the whole of bulk substrate layer 202 results also in removal of a bottom portion of buried oxide layer 203 and a bottom portion of electrically conducting layer 209. As such, remains of electrically conducting layer 209 include first portion 209A and second portion 209B in electrical contact with respective remaining portions of buried oxide layer 203. For example, first portion 209A and second portion 209B may be at opposite ends of the top surface of remaining buried oxide layer 203 and/or at opposite sidewalls of remaining buried oxide layer 203 in a lateral direction, i.e. in the direction parallel to the top surface of the buried oxide layer 203 or the top surface of the active semiconductor layer 204.

FIG. 2I shows trench 217 filed with fiber optic material 218. In some embodiments, fiber optic material 218 may comprise silicon oxide. In some embodiments, fiber optic material 218 may be an index matching material, such as an index matching gel. Index matching gel (IMG) is a silicone based synthetic fluid that is combined with insoluble microscopic powders to produce a thixotropic gel. IMG is a ready-to-use, single component material requiring no curing. IMG is highly inert and chemically stable over a wide temperature range such as from −59° C. to in excess of 270° C. Important characteristics of an IMG are optical clarity and refractive index (RI). An IMG can be produced with a variety of different specific RIs. A specific refractive index of index matching material, such as index matching gel, may be selected to match a refractive index on one of materials that fiber optic material 218 is in contact with.

Fiber optic material 218 can deliver light from light source 219 to optical guide 205 in active semiconductor layer 204. Light source 219 may be a monochromatic light source, such as a laser. Light source 219 may be also an outlet of an optical fiber that delivers light from a more distant light source.

FIG. 2I also shows electrical contacts 220, which provide electrical connect between device 200' and external electrical chip 221 though electrical circuit of BEOL structure 214, such as through metallization structures 214M of BEOL structure 214.

Figure 2J:
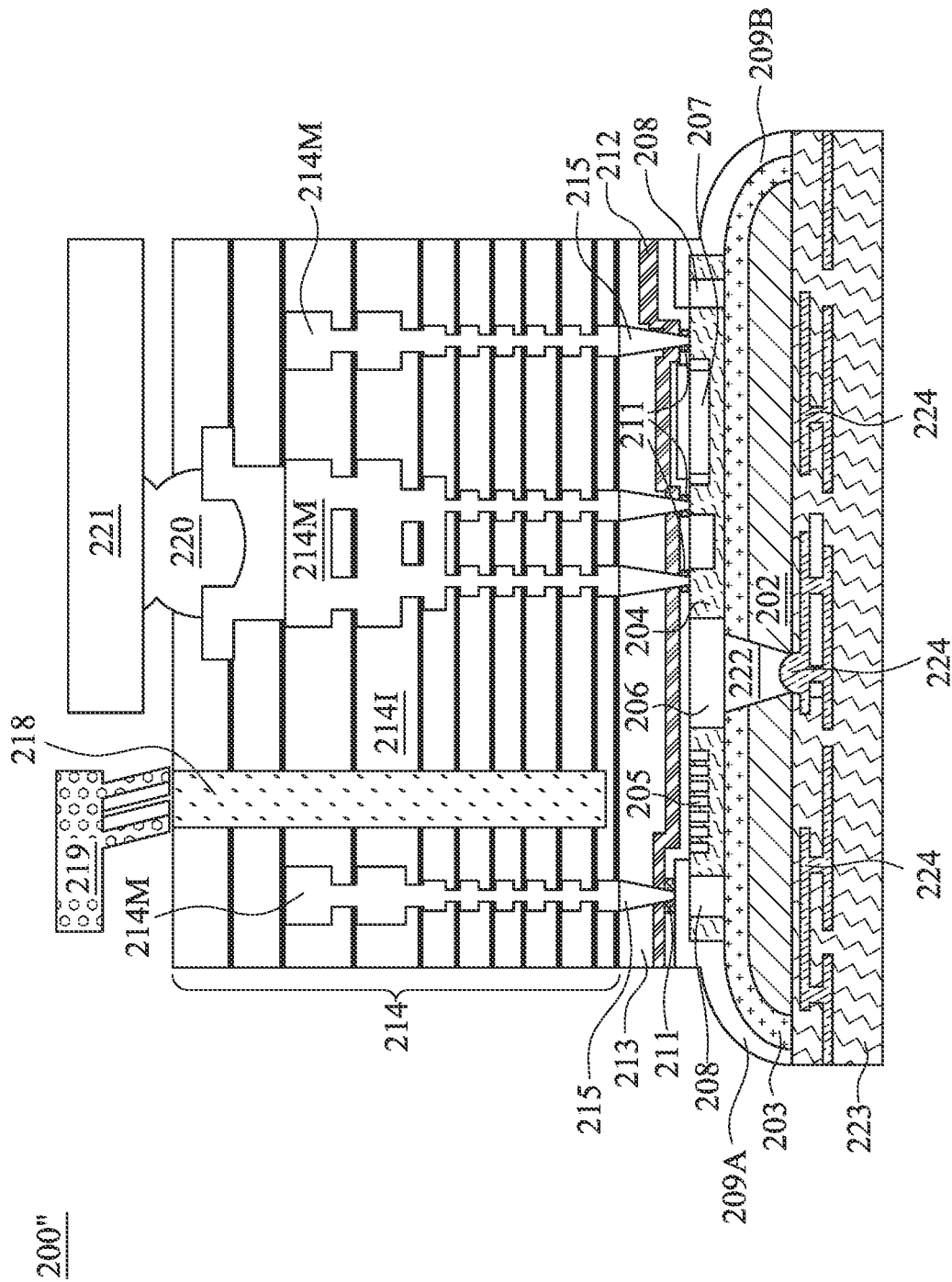

FIG. 2J photonic and/or optoelectronic device 200", which may be also formed from device 200 by removing a bottom portion or the whole of bulk substrate layer 202. Device 200" is similar to device 200'. Device 200" is packaged with another substrate 223 (an additional substrate or a second substrate with SOI substrate 201 being a first substrate) having electrical circuit 224 having a plurality of contacts. For such packaging, device [200] 200" may be aligned with at least a portion of substrate 223. For the packaging with substrate 223, device 200" may have one or more electrically conducting vias, such as via 222 penetrating the remaining SOI substrate to provide an electrical connection between STI structure 206, which may include one or more gate structures, in active semiconductor layer 204 to one of the contacts in electrical circuit 224 of substrate 223. As such, via 222 may extend through at least a portion of active semiconductor layer 204, buried oxide layer 203 and remaining, if any, bulk substrate layer 202.

In one aspect of the present disclosure, a method of fabricating a photonic device is disclosed. The method includes forming a photonic device structure comprising a SOI substrate, wherein the SOI substrate comprises a bulk substrate layer, a buried oxide layer on the bulk substrate layer and an active semiconductor layer on the buried oxide layer; forming an electrically conducting layer in electrical contact with the buried oxide layer; and forming a BEOL structure on a surface of the active semiconductor layer.

In another aspect of the present disclosure, a photonic device is disclosed. The photonic device includes an SOI substrate, which includes a buried oxide layer and an active semiconductor layer on the buried oxide layer; a BEOL structure on a surface of the active semiconductor layer, and a first electrically conducting layer in electrical contact with a first portion of the buried oxide layer and a second electrically conducting layer in electrical contact with a second portion of the buried oxide layer. The second portion of the buried oxide layer is opposite to the first portion of the buried oxide layer in a direction parallel to the surface of the active semiconductor layer.

In yet another aspect of the present disclosure, a method of fabricating a photonic device is disclosed. The method includes forming a photonic device structure which includes: an SOI substrate, wherein the SOI substrate includes a bulk substrate layer, a buried oxide layer on the bulk substrate layer and an active semiconductor layer on the buried oxide layer; an electrically conducting layer in electrical contact with the buried oxide layer; and a BEOL structure on a surface of the active silicon layer. The method further includes placing the formed photonic structure into an electrically conducting holder so that the electrically conducting holder has an electrical contact with the electrically conducting layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a photonic device comprising:
forming a photonic device structure comprising a SOI substrate, wherein the SOI substrate comprises a bulk substrate layer, a buried oxide layer on the bulk substrate layer and an active semiconductor layer on the buried oxide layer;
forming an electrically conducting layer in electrical contact with the buried oxide layer; and
forming a BEOL structure on a surface of the active semiconductor layer.

2. The method of claim 1, wherein the photonic device structure comprises an optical waveguide patterned in the active semiconductor layer.

3. The method of claim 1, wherein the photonic device structure comprises an optical detector patterned in the active semiconductor layer.

4. The method of claim 1, wherein the electrically conducting layer comprises a doped conducting polymer.

5. The method of claim 4, wherein the electrically conducting layer comprises doped polyaniline.

6. The method of claim 1, further comprising placing the photonic device structure with the formed electrically conducting layer into an electrically conducting holder, so that the electrically conducting holder has an electrical contact with the electrically conducting layer.

7. The method of claim 6, further comprising modifying the photonic device structure placed into the electrically conducting holder, wherein said modifying introduces a static electric charge in the buried oxide layer.

8. The method of claim 7, wherein said modifying comprises etching one or more insulating layer(s) in the BEOL structure.

9. The method of claim 7, wherein the photonic device structure comprises an optical waveguide patterned in the active semiconductor layer and said modifying comprises etching a trench through insulating layers of the BEOL structure towards the optical waveguide.

10. The method of claim 9, further comprising filling the trench with a fiber optic material.

11. The method of claim 6, further comprising performing electron microscopy on the photonic device structure placed into the electrically conducting holder.

12. The method of claim 1, further comprising removing at least a portion of the bulk substrate layer.

13. A method of fabricating a photonic device comprising:
forming a photonic device structure comprising:
- an SOI substrate, wherein the SOI substrate comprises a bulk substrate layer, a buried oxide layer on the bulk substrate layer and an active semiconductor layer on the buried oxide layer;
- an electrically conducting layer in electrical contact with the buried oxide layer;
- a BEOL structure on a surface of the active silicon layer; and placing the formed photonic structure into an electrically conducting holder so that the electrically conducting holder has an electrical contact with the electrically conducting layer.

14. The method of claim 13, further comprising one or more of performing electron microscopy on the photonic device structure placed into the electrically conducting holder and modifying the photonic device structure placed into the electrically conducting holder.

15. The method of claim 3, wherein the optical detector is a Si detector or a Ge detector.

16. The method of claim 1, wherein the electrically conducting layer comprises doped silicon.

17. The method of claim 2, further comprising forming the optical waveguide by implanting the active semiconductor layer with impurities.

18. The method of claim 2, wherein a thickness of the buried oxide layer is at least 2 times less than a wavelength of light used by the waveguide.

19. The method of claim 1, wherein the electrically conducting layer has a conductivity of at least $1 \times 10^{-3}$ S/cm.

20. The method of claim 1, wherein the electrically conducting layer has a thickness from 1 μm to 1000 μm.

* * * * *